US009645171B1

(12) United States Patent
Lynch et al.

(10) Patent No.: US 9,645,171 B1
(45) Date of Patent: May 9, 2017

(54) TRAVELING WAVE DETECTOR (71) Applicants: Jonathan J Lynch, Oxnard, CA (US); Brian Hughes, Woodland Hills, CA (US)

(72) Inventors: Jonathan J Lynch, Oxnard, CA (US); Brian Hughes, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 745 days.

(21) Appl. No.: 13/668,262

(22) Filed: Nov. 3, 2012

(51) Int. Cl.
*G01S 3/02* (2006.01)
*G01R 1/00* (2006.01)
*G02B 1/00* (2006.01)

(52) U.S. Cl.
CPC .............. *G01R 1/00* (2013.01); *G02B 1/00* (2013.01); *H04B 2201/00* (2013.01)

(58) Field of Classification Search
CPC ........ G01R 1/00; G02B 1/00; G02B 2207/00; H01L 21/00; H02J 1/00; H04B 1/00; H04B 2201/00; H04B 2203/00; H04B 2215/00
USPC ......... 324/76.11, 76.12, 76.14, 76.39, 76.44, 324/76.54, 76.56, 84, 87, 95
See application file for complete search history.

(56) References Cited

U.S. PATENT DOCUMENTS

| 3,600,708 | A |  | 8/1971 | King |  |
|---|---|---|---|---|---|
| 4,594,557 | A | * | 6/1986 | Shillady | H03D 1/10 327/493 |
| 6,078,794 | A | * | 6/2000 | Peckham et al. | 455/127.4 |
| 7,042,740 | B2 | * | 5/2006 | Morimoto et al. | 363/24 |
| 2004/0000963 | A1 | * | 1/2004 | Killen et al. | 333/35 |
| 2005/0200550 | A1 | * | 9/2005 | Vetrovec et al. | 343/820 |
| 2007/0018739 | A1 | * | 1/2007 | Gabara | G06F 1/10 331/167 |
| 2007/0069820 | A1 | * | 3/2007 | Hayata et al. | 330/298 |
| 2007/0136010 | A1 | * | 6/2007 | Gunn et al. | 702/62 |
| 2007/0202912 | A1 | * | 8/2007 | Wu | H02J 13/0003 455/522 |
| 2007/0273458 | A1 | * | 11/2007 | Pepper | G01R 1/24 333/167 |

(Continued)

OTHER PUBLICATIONS

Goldsmith, C. L. et al., "Coherent Combining of RF Signals in a Traveling-Wave Photodetector Array," IEEE Photonics Technology Letters, vol. 9, No. 7, Jul. 1997, pp. 988-990.

(Continued)

*Primary Examiner* — Jermele M Hollington
*Assistant Examiner* — Temilade Rhodes-Vivour
(74) *Attorney, Agent, or Firm* — North Shore Associates (57) ABSTRACT

A traveling wave detector and method of traveling wave signal detection employ a plurality of detector diodes connected according to different polarities with respect to adjacent ones of the detector diodes. The traveling wave detector includes a transmission line having an input end and a terminal end and the plurality of detector diodes connected as stated above and spaced apart along the transmission line. The traveling wave detector further includes a plurality of direct current (DC) blocks to define a series conduction path. The method of traveling wave signal detection includes rectifying a received incident signal using the traveling wave detector to produce a video signal at each of the detector diodes and summing the video signals along the series conduction path to produce an output video signal.

20 Claims, 3 Drawing Sheets

(56) References Cited

U.S. PATENT DOCUMENTS

2010/0295383 A1* 11/2010 Cummings ....... H01L 31/02021
                                                                  307/151
2011/0012661 A1*  1/2011 Binder ......................... 327/276
2013/0157584 A1*  6/2013 Tekin ....................... H03L 5/00
                                                                   455/73

OTHER PUBLICATIONS

Winkelmann, L. E. et al., "Slow-Wave Mode Rectification on Non-Linear Microstrip," Journal of Microwave Power and Electromagnetic Energy, vol. 32, No. 4, 1997, pp. 223-232.
Shillady, R. W., "High Dynamic Range Video Detector," IEEE MTT-S Digest, 1986, pp. 301-304.

* cited by examiner

FIG. 6

TRAVELING WAVE DETECTOR

CROSS-REFERENCE TO RELATED APPLICATIONS

N/A

STATEMENT REGARDING FEDERALLY SPONSORED RESEARCH OR DEVELOPMENT

N/A

BACKGROUND

1. Technical Field

The invention relates to radio frequency (RF), microwave and millimeter wave circuits and systems. In particular, the invention relates to detectors used with RF, microwave and millimeter wave signals.

2. Description of Related Art

Radio frequency (RF) detectors, microwave detectors and millimeter wave detectors are circuits used to rectify and detect RF, microwave and millimeter wave signals, respectively. In some examples, RF/microwave/millimeter wave signal detection may be used to determine a power level of an RF/microwave/millimeter wave signal. In these examples, the RF/microwave/millimeter wave detector acts as a power detector. In other examples, the RF/microwave/millimeter wave detector may be employed to detect an amplitude modulation of the RF/microwave/millimeter wave signal. In particular, the RF/microwave/millimeter wave detector may be used to demodulate the amplitude modulation and produce a baseband or video signal representing an envelop of the amplitude modulation, for example. As such, RF/microwave/millimeter wave detectors are also sometimes characterized as 'envelop' detectors.

A variety of RF/microwave/millimeter wave detectors has been developed including various detectors based on or using detector diodes. Detector diodes used in RF/microwave/millimeter wave detectors are typically semiconductor diodes having a relatively low junction capacitance and a high sensitivity in frequency ranges (e.g., RF, microwave and/or millimeter wave) of interest. Examples of semiconductor diodes that are often used as detector diodes include, but are not limited to, Schottky diodes (both zero-bias and biased), planar doped barrier diodes, and backward tunneling or Esaki diodes. Unfortunately, many RF/microwave/millimeter wave detectors have a relatively limited operational bandwidth. In particular, it may often be difficult to achieve wideband impedance matching in conventional diode-based detector circuits leading to the limited operational bandwidth. The wideband impedance matching may be limited due to an inherent reactance (e.g., junction capacitance) of the diodes employed in the RF/microwave/millimeter wave detector, for example.

BRIEF SUMMARY

In some embodiments, a traveling wave detector is provided. The traveling wave detector comprises a transmission line having an input end and a terminal end. The traveling wave detector further comprises a plurality of detector diodes spaced apart along the transmission line between the input and terminal ends. Adjacent ones of the detector diodes are connected to the transmission line according to a different polarity with respect to one another. The traveling wave detector further comprises a plurality of direct current (DC) blocks. The DC blocks are configured to define a series conduction path through the plurality of detector diodes according to the different polarity connections.

In some embodiments, another traveling wave detector is provided. The traveling wave detector comprises a first diode-loaded transmission line (DTL) segment. The first DTL segment comprises a first detector diode and a first DC block. The first detector diode is connected according to a first polarity between a first conductor and a second conductor of a transmission line. The first DC block is located in the second conductor between an input of the first DTL segment and the first detector diode. The traveling wave detector further comprises a second DTL segment. The second DTL segment comprises a second detector diode and a second DC block. The second detector diode is connected according to a second polarity between the first conductor and the second conductor of the transmission line. The second DC block is located in the first conductor between an input of the second DTL segment and the second detector diode. The input of the second DTL segment is connected to an output of the first DTL segment at corresponding ones of the first and second conductors.

In some embodiments, a method of traveling wave signal detection is provided. The method of traveling wave signal detection comprises receiving an incident signal using a traveling wave detector. The traveling wave detector comprises a plurality of detector diodes and a plurality of direct current (DC) blocks. The detector diodes are spaced apart along a transmission line between an input end and a terminal end of the transmission line with adjacent ones of the detector diodes being connected to the transmission line according to a different polarity from one another. The plurality of DC blocks are arranged to define a series conduction path through the plurality of detector diodes. The method of traveling wave signal detection further comprises rectifying the incident signal with the detector diodes to produce a video signal at each of the detector diodes. The method of traveling wave signal detection further comprises summing the video signals produced at each of the detector diodes along the series conduction path to produce an output video signal.

BRIEF DESCRIPTION OF THE DRAWINGS

Various features of embodiments in accordance with the principles of the present invention described herein may be more readily understood with reference to the following detailed description taken in conjunction with the accompanying drawings, where like reference numerals designate like structural elements, and in which.

Certain embodiments according to the principles of the present invention have other features that are one of in addition to and in lieu of the features illustrated in the above-referenced figures. These and other features are detailed below with reference to the above-referenced figures.

DETAILED DESCRIPTION

Embodiments consistent with the principles of the present invention provide a traveling wave detector having a wide operational bandwidth. In particular, traveling wave detectors according to the present invention employ a plurality of detector diodes distributed in a traveling wave architecture that affords wideband impedance matching. The wideband impedance matching may enable the traveling wave detector to exhibit a wide operational bandwidth across portions of one or more of a radio frequency (RF) range, a microwave frequency range and a millimeter wave frequency range, according to various embodiments of the present invention. In some examples, a resulting detector responsivity, e.g., Volts (V) out per Watts (W) in, of the plurality of detector diodes in the traveling wave detector may be substantially similar to a responsivity of a single detector diode of the plurality, albeit over a typically much wider frequency range.

As used herein, the article 'a' is intended to have its ordinary meaning in the patent arts, namely 'one or more'. For example, 'a signal' means one or more signals and as such, 'the signal' means 'the signal(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 20%, or plus or minus 10%, or plus or minus 5%, or plus or minus 1%, unless otherwise expressly specified. Moreover, examples and embodiments herein are intended to be illustrative only and are presented for discussion purposes and not by way of limitation.

Figure 1:
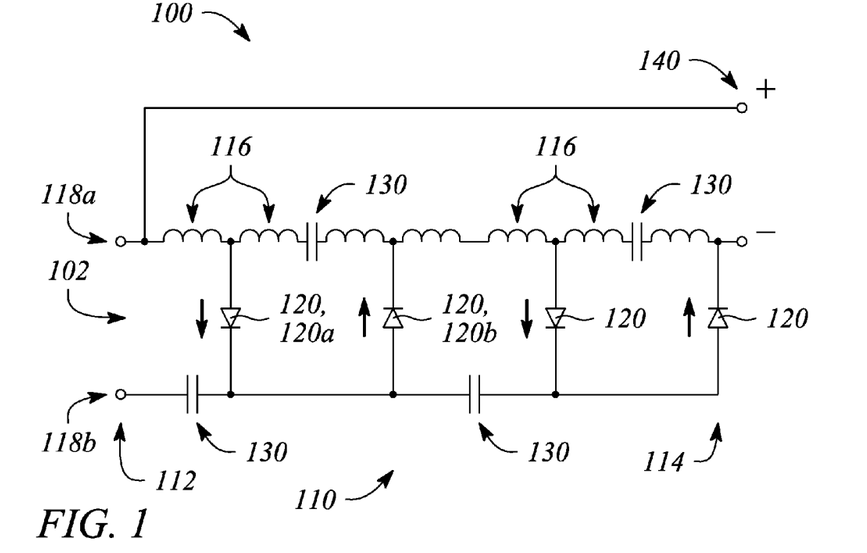
FIG. 1 illustrates a schematic block diagram of a traveling wave detector 100, according to an embodiment consistent with the principles of the present invention.

FIG. 1 illustrates a schematic block diagram of a traveling wave detector 100, according to an embodiment consistent with the principles of the present invention. The traveling wave detector 100 has an input port 102 configured to receive an input signal. In some examples, the input signal comprises a radio frequency (RF) signal. In other examples, the input signal comprises a microwave signal. In yet other examples, the input signal comprises a millimeter wave signal.

In some examples, the input signal may be a broadband signal that spans one or more of the RF, microwave or millimeter wave frequency range. For example, the input signal may comprise a plurality of frequencies having a maximum frequency $f_{max}$ or equivalently a maximum wavelength $\lambda_{max}$ (i.e., $\lambda_{max} = c_{eff}/f_{max}$, where $c_{eff}$ is an effective wave propagation velocity). According to various examples, the traveling wave detector 100 rectifies or detects an incident power of the input signal. An output of the traveling wave detector 100 is an output signal that has a characteristic (e.g., a voltage, a current, etc.) proportional to the detected incident power, according to some examples.

As illustrated in FIG. 1, the traveling wave detector 100 comprises a transmission line 110 having an input end 112 and a terminal end 114. According to some embodiments, the input end 112 corresponds to or is substantially coincident with the input port 102 of the traveling wave detector 100. The transmission line 110 is configured to support propagation of the input signal from the input end 112 to the terminal end 114 as a 'traveling wave', according to various examples. According to some examples, the traveling wave is substantially absorbed by the traveling wave detector 100 before reaching the terminal end 114. The traveling wave detector 100 may provide a good input match over a broad bandwidth, according to some examples.

According to various embodiments, the transmission line 110 may be realized as any of a variety of so-called 'real' transmission lines. For example, the real transmission line may comprise a printed circuit transmission line such as, but not limited to, microstrip, stripline, co-planar waveguide, and slotline transmission lines. In other examples, the real transmission line may comprise one or more of several cable-style transmission lines including, but not limited to, a coaxial cable, a twisted pair cable and a twin-lead cable. In these various examples, the transmission line 110 generally comprises two or more conductor traces, wires or leads (i.e., 2 or more conductors). In yet other examples, the transmission line 110 realized as a real transmission line may comprise various waveguides and waveguide-like structures. In these waveguides, there may be one (e.g., rectangular waveguides and circular waveguides) or even no conductor present (e.g., as with dielectric waveguides).

In other embodiments, the transmission line 110 may comprises an artificial transmission line. In particular, as an artificial transmission line, the transmission line 110 may comprise a plurality of series inductances and a plurality of shunt capacitances that combine together to provide a characteristic impedance, a transmission time delay, a phase shift and other parameters characteristic of a real transmission line. For example, the transmission line 110 illustrated in FIG. 1 may represent an artificial transmission line. The series inductances of the artificial transmission line 110 illustrated in FIG. 1 may be provided by actual series inductors 116 (e.g., lumped element inductors), for example. In other examples, the series inductances may be merely represented as series inductors 116 and be provided instead by a distributed inductance of a structure or conductor (e.g., a conductor trace or wire) of the transmission line 110. According to some examples, the series inductors 116 or more generally the series inductances of the transmission line 110 may be employed to produce a real input impedance at the input port 102 of the transmission line 110. The real input impedance may be matched to a source impedance of the input signal over a relatively broad bandwidth, according to some examples.

The traveling wave detector 100 further comprises a plurality of detector diodes 120. According to various embodiments, the detector diodes 120 are located spaced apart along the transmission line 100 between the input end 112 and the terminal end 114. In some examples, there may be as few as two detector diodes 120 in the plurality. In other examples, there may be three, four, five or more detector diodes 120 in the plurality. For example, four detector diodes are illustrated in FIG. 1.

In some examples, a spacing between the detector diodes 120 is less than about one quarter (¼) of a wavelength of a maximum frequency of the input signal I(e.g., $S < \lambda_{max}/4$). The spacing S may be much less than $\lambda_{max}/4$, according to some examples (e.g., $S < \lambda_{max}/10$). Detector diodes 120 are configured to couple a portion of the signal power of the input signal as it propagates along the transmission line 110, according to various embodiments. The coupled signal power portion may be rectified by the detector diodes 120, for example.

As illustrated in FIG. 1, the detector diodes 120 are located spaced apart by pairs of the series inductors 116 along the transmission line 110. Further as illustrated, the detector diodes 120 are connected as shunt elements. In particular, the detector diodes 120 are connected in shunt between a first conductor 118a and a second conductor 118b of the transmission line 110, as illustrated in FIG. 1. Note that while the inductors 116 illustrated in FIG. 1 are confined to the first conductor 118a of the transmission line 110, in other examples the inductors 116 may be either confined to the second conductor 118b or located in both of the first and second conductors 118a, 118b. Further, the inductors 116 illustrated in FIG. 1 may represent lumped element inductors (e.g., for an artificial transmission line) or may represent an inductance per unit length of the transmission line 110 such as when a real transmission line is employed. In some examples, the inductors 116 may represent both of an inductance per unit length of the real transmission line and lumped element inductors.

According to various examples, adjacent ones of the detector diodes 120 are connected according to a different polarity with respect to one another. For example, a first detector diode 120a closest to the input end 112 of the transmission line 110 may be connected in or according to a first polarity. A second detector diode 120b adjacent to the first detector diode 120a may be connected in or according to a second polarity, which is different from the first polarity.

In particular, as illustrated in FIG. 1, the first and second detector diodes 120a, 120b are connected in shunt between the first and second conductors 118a, 118b of the transmission line 110. Further, as illustrated, a cathode of the first detector diode 120a is connected to the second conductor 118b and an anode of the first detector diode 120b is connected to the first conductor 118a of the transmission line 110 to provide the first polarity connection. Still further, as illustrated, the cathode of the second detector diode 120b is connected to the first conductor 118a while the anode of the second detector diode 120b is connected to the second conductor 118b to provide the second polarity connection.

The illustrated connection of the first detector diode 120a provides a forward conduction path (e.g., illustrated by an arrow adjacent to the first detector diode 120a in FIG. 1) that is in a downward direction from the first conductor 118a to the second conductor 118b, as illustrated. Similarly, the illustrated connection of the second detector diode 120b provides a forward conduction path (e.g., illustrated by an arrow adjacent to the second detector diode 120b in FIG. 1) that is in the upward direction from the second conductor 118b to the first conductor 118a, as illustrated. As illustrated, other pairs of detector diodes 120 alternate in their respective connection polarities along the traveling wave detector 100.

According to various embodiments, the detector diodes 120 may comprise any of a variety of diodes and diode-like elements used to rectify an alternating current (AC) signal. For example, a detector diode 120 may comprise a backward tunneling diode also referred to as back tunnel or Esaki tunnel diode. In other examples, the detector diode 120 may comprise a Schottky diode. In some examples, the detector diode 120 may be unbiased (e.g., a zero-bias Schottky diode). In other examples, a bias voltage or a bias current may be applied to bias the detector diode 120.

Referring again to FIG. 1, the traveling wave detector 100 further comprises a plurality of direct current (DC) blocks 130. The DC blocks 130 are configured to define a series conduction path (e.g., a forward conduction path) through the plurality of detector diodes 120. In particular, the series conduction path is a conduction path that is defined by the DC blocks 130 according to the different polarity connection of the detector diodes 120. For example, locations of the DC blocks 130 may alternate between the second conductor 118b and the first conductor 118a, as illustrated in FIG. 1. The alternating locations may place a DC block 130 between every other pair of the detector diodes 120 along a given (e.g., first or second) one of the conductors 118a, 118b.

Figure 2:
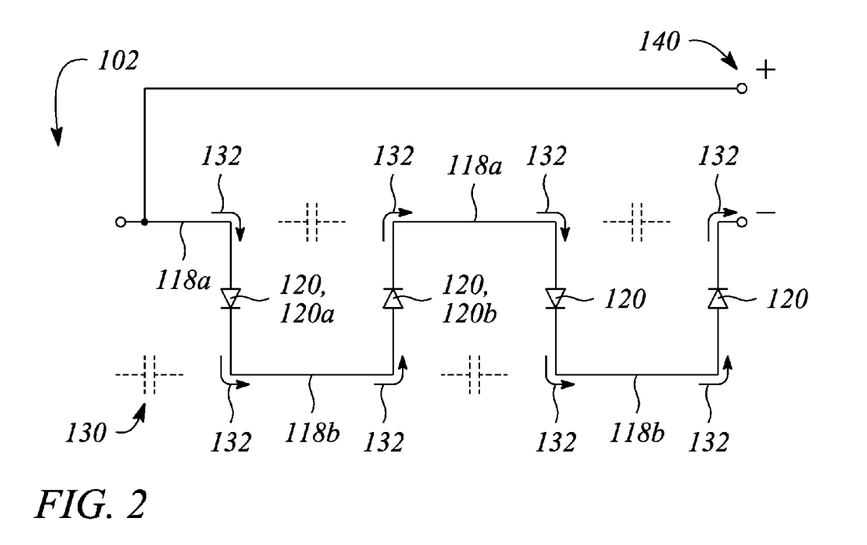
FIG. 2 illustrates a diagram of a conduction path defined by DC blocks in the traveling wave detector of FIG. 1, according to an embodiment of the present invention.

FIG. 2 illustrates a diagram of a conduction path 132 defined by DC blocks 130 through the detector diodes 120 in the traveling wave detector 100 of FIG. 1, according to an embodiment of the present invention. In particular, as illustrated in FIG. 2, the conduction path 132 begins on the first conductor 118a at the input port 102. The conduction path 132 passes through the first detector diode 120a (e.g., as a forward conduction path), along the second conductor 118b and through the second detector diode 120b. Only those portions of the conductors 118a, 118b that represent the conduction path 132 are illustrated in FIG. 2 for simplicity of illustration. DC blocks 130 define the conduction path 132 and are illustrated as dashed line elements. The DC blocks 130 are associated with other portions (not illustrated) of the conductors 118a, 118b. The DC blocks 130 act to block conduction at the input port 102 and just beyond the second detector diode 120b along the second conductor 118b, as illustrated. The conduction path 132 illustrated in FIG. 2 may represent a DC conduction path carrying current flowing in the traveling wave detector 100, according to some examples.

In some examples, the DC block 130 comprises a capacitor. For example, the DC block 130 may be a lumped element capacitor. In other examples, the DC blocks 130 may be realized as a capacitance provided by other than a lumped element capacitor (e.g., a narrow gap between adjacent conductors). According to various examples, the DC block 130 of the traveling wave detector 100 is substantially similar to a short circuit in an operational frequency range of the traveling wave detector 100. For example, a capacitance of the DC block 130 is high enough to appear as a short circuit at frequencies of the input signal. The DC block 130 prevents signals at frequencies below, and in some examples substantially below, the operational frequency range (e.g., DC) from passing through the DC block 130, according to various examples.

Referring again to FIG. 1, the traveling wave detector 100 may further comprises a video output port 140, according to some examples. For example, the video output port 140 may have a first terminal (+) and a second terminal (−). The first terminal may be connected or correspond to the input port 102 of the transmission line 110 while the second terminal may be connected or correspond to the terminal end of the transmission line 110, according to some examples. In some examples, the first and second terminals are configured such that the video output port 140 substantially 'bridges' (i.e., connects across a beginning and an end of) the series conduction path 132.

The video output port 140 is configured to provide a video signal produced by the rectification of the input signal by the detector diodes 120, according to various examples. In particular, the series conduction path defined by the DC blocks 130 in conjunction with the different polarity connection of the detector diodes 120 may enable voltages across the detector diodes 120 (due to the input signal traveling along a length of the traveling wave detector 120) to add together, according to some examples. The voltages, when added together, form the video signal at the video output port 140, according to various examples.

For example, as illustrated FIG. 1, the first terminal (+) is connected to the first conductor 118*a* at the input port 102 of the traveling wave detector 100. The second terminal (−) is connected to an end of the conduction path at an output of a last detector diode 120 along the transmission line 110. In particular, the second terminal (−) is connected to the cathode of a fourth detector 120 after a final DC block 130 along the first conductor 118*a* adjacent to the terminal end 114 of the transmission line 110, as illustrated for example. FIG. 2 illustrates the first and second terminals of the video output port 140 depicting the video output port 140 bridging the series conduction path 132, for example.

In some examples, the traveling wave detector 100 further comprises a lowpass filter (not illustrated). The lowpass filter may be connected to filter the video signal, for example. In particular, the lowpass filter may be referred to as a video filter and may be configured to substantially remove frequencies associated with an input signal (e.g., RF/microwave signal) from the video signal at the output of the low pass filter, according to some examples. The lowpass filter may comprise a series inductor and a shunt capacitor, for example. Other lowpass filter configurations may be used instead of or in addition to the lowpass filter described above.

In some embodiments, an impedance of the transmission line 110 is varied along a length of the traveling wave detector 100 from the input end 112 at the input port 102 to the terminal end 114. The variation of impedance is configured to differentially distribute the signal power of the input signal among the detector diodes 120 of the plurality, according to some examples. In particular, in some examples, the differential distribution of signal power provides about an equal distribution of signal power to each of the detector diodes 120. For example, device impedances (e.g., of the detector diodes 120) as well as values of elements that make up the transmission line 110 (e.g., series inductances) may be varied to provide a desired differential distribution. In some examples, matching elements may be added (not shown) to adjust signal coupling at the detector diodes 120.

In some examples, the input signal may be completely absorbed or coupled into the detector diodes 120 by the time the input signal reaches the terminal end 114 of the transmission line 110. In other examples, the input signal may not be completely absorbed. In some examples, any residual input signal may be dissipated by a resistive termination at the terminal end 114 of the transmission line 110. In particular, the traveling wave detector 100 may further comprise a resistive termination at the terminal end 114 of the transmission line 110 (not illustrated).

Figure 3:
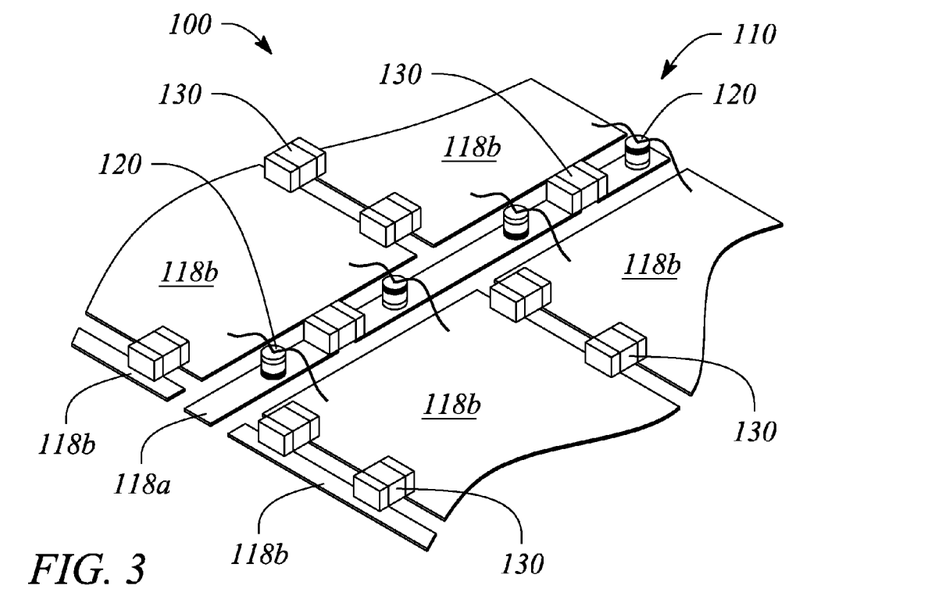
FIG. 3 illustrates a perspective view of a traveling wave detector, according to an embodiment of the present invention.

FIG. 3 illustrates a perspective view of a traveling wave detector 100, according to an embodiment of the present invention. In particular, FIG. 3 illustrates the traveling wave detector 100 realized using a coplanar waveguide (CPW) transmission line 110. The first conductor 118*a* of the transmission line 110 comprises a central conductor of the CPW while the second conductor 118*b* comprises adjacent ground plane conductors of the CPW. As illustrated, detector diodes 120 are mounted to the central conductor (i.e., the first conductor 118*a*) and interconnected using bond wires to the adjacent ground planes (i.e., the second conductor 118*b*). Every other detector diode 120 is mounted inverted relative to an adjacent neighboring detector diode 120 (illustrated by shading of an end of the diodes 120 by way of example) to provide the different polarity of the detector diodes 120 along a length of the traveling wave detector 100, as illustrated. The DC blocks 130 comprise chip capacitors that bridge gaps in the central conductor 118*a* and the ground planes 118*b* between adjacent pairs of the detector diodes, as illustrated in FIG. 3.

Figure 4:
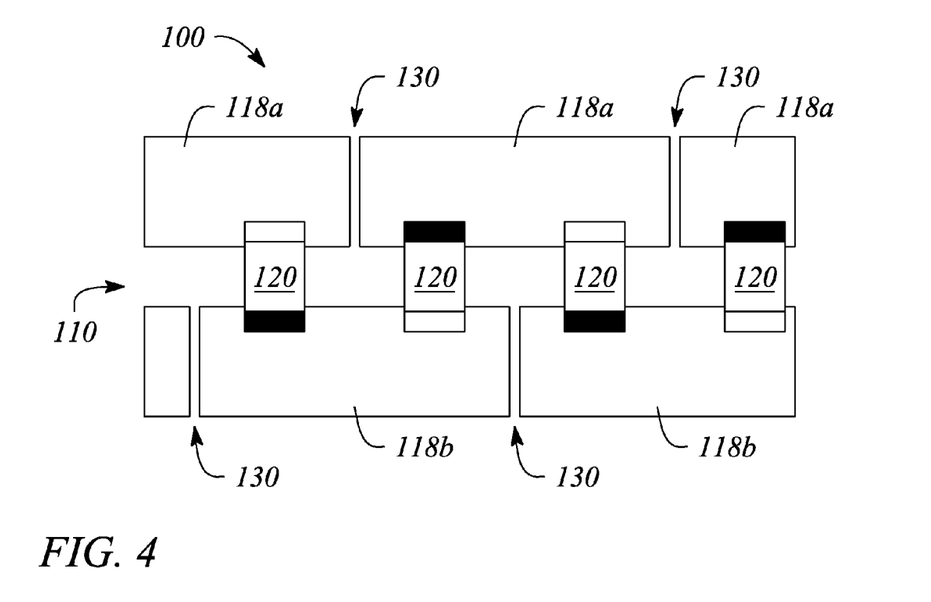
FIG. 4 illustrates a top view of a traveling wave detector, according to an embodiment of the present invention.

FIG. 4 illustrates a top view of a traveling wave detector 100, according to an embodiment of the present invention. In particular, FIG. 4 illustrates the traveling wave detector 100 realized using a printed two-lead transmission line 110. A first conductor trace of the printed two-lead transmission line 110 of FIG. 4 serves as the first conductor 118*a* while a second conductor trace serves as the second conductor 118*b*. As illustrated, the detector diodes 120 are mounted in an alternating fashion (illustrated by a shaded end of the chip-style diodes 120, for example) on the first and second conductor traces 118*a*, 118*b*. DC blocks 130 comprise narrow gaps in the two conductor traces 118*a*, 118*b*, as illustrated. In other examples, the gaps themselves may serve as the DC blocks 130.

Figure 5:
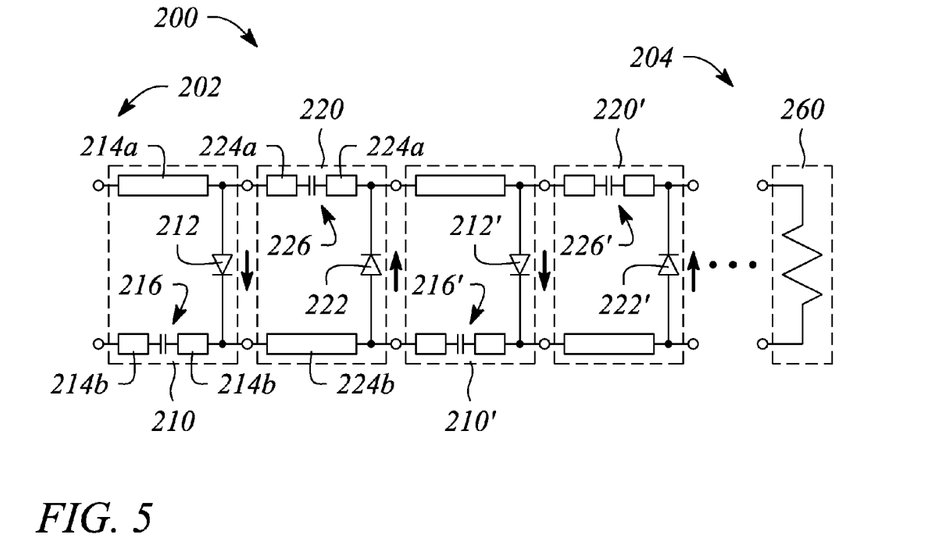
FIG. 5 illustrates a schematic block diagram of a traveling wave detector, according to another embodiment of the present invention.

FIG. 5 illustrates a block diagram of a traveling wave detector 200, according to another embodiment of the present invention. The traveling wave detector 200 has an input port 202 configured to receive an input signal. When received, the input signal propagates along the traveling wave detector 200 toward a terminal end 204 of the traveling wave detector 200, according to various examples. In some examples, an input impedance of the traveling wave detector 200 is substantially matched to a source impedance of a source of the input signal. The impedance match may be provided over a relatively broad bandwidth (e.g., greater than 2:1), according to various examples.

As illustrated in FIG. 5, the traveling wave detector 200 comprises a first diode-loaded transmission line (DTL) segment 210. The first DTL segment 210 comprises a detector diode 212 connected according to a first polarity between a first conductor 214*a* and a second conductor 214*b* of the first DTL segment 210. For example, the first polarity connection may comprise a cathode of the detector diode 212 connected to the first conductor 214*a* and an anode of the detector diode 212 connected to the second conductor 214*b*, as illustrated. Alternatively (not illustrated), the first polarity connection may comprise the anode of the detector diode 212 connected to the first conductor 214*a* and the cathode of the detector diode 212 connected to the second conductor 214*b*. The first DTL segment 210 further comprises a DC block 216 in the second conductor 214*b*. In particular, the DC block 216 is located in the second conductor 214*b* between an input of the first DTL segment 210 and the detector diode 212 at an output of the first DTL segment 210.

The traveling wave detector 200 illustrated in FIG. 5 further comprises a second DTL segment 220. The second DTL segment 220 comprises a detector diode 222 connected according to a second polarity between a first conductor 224*a* and a second conductor 224*b* of the second DTL segment 220. For example, the second polarity connection may comprise a cathode of the detector diode 222 connected to the first conductor 224*a* and an anode of the detector diode 222 connected to the second conductor 224*b*, as illustrated. Alternatively (not illustrated), the second polarity connection may comprise the anode of the detector diode 222 connected to the first conductor 224*a* and the cathode of the detector diode 222 connected to the second conductor 224*b*. However, the second polarity connection is by definition different from the first polarity connection. The second DTL segment 220 further comprises a DC block 226 in the second conductor 224*b*. In particular, the DC block 226 is located in the first conductor 224*a* between an input of the second DTL segment 220 and the detector diode 222 at an output of the second DTL segment 220.

According to various embodiments, the second DTL segment input is connected to an output of the first DTL segment 210 at corresponding ones of the first and second conductors of the DTL segments 210, 220. In particular, the first conductor 224a of the second DTL segment 220 is connected to the first conductor 214a of the first DTL segment 210 while the second conductor 224b of the second DTL segment 220 is connected to the second conductor 214b of the first DTL segment 210, as illustrated. In some examples, the detector diodes 212, 222 are located at or adjacent to the outputs of respective ones of the first and second DTL segments 210, 220 (e.g., also as illustrated).

According to some embodiments, the traveling wave detector 200 comprises additional DTL segments 210', 220' connected in series to an output of the second DTL segment 220. Each of the additional DTL segments 210' alternates with each of the additional DTL segments 220' and each segment has a respective detector diode 212', 222' and a DC block 216', 226'. The respective detector diodes 212', 222' and DC blocks 216', 226' are connected as in (i.e., in a configuration corresponding to) the corresponding first DTL segment 210 or the corresponding second DTL segment 220. Each additional DTL segment connected in series following the second DTL segment 220 has an input connected to an output of a preceding DTL segment 210', 220' at corresponding ones of the first and second conductors. Further, detector diode connections and DC block connections alternate between the connections of the first DTL segment 210 and the connections of the second DTL segment 220 along a length of the traveling wave detector 200.

For example, as illustrated in FIG. 5, a first additional DTL segment 210' following the second DTL segment 220 may have the detector diode 212' and the DC block 216' connected in a manner corresponding to the connection of the first DTL segment 210. Likewise, a second additional DTL segment 220' following the first additional DTL segment 210' may have the detector diode 222' and the DC block 226' connected in a manner corresponding to the connection of the second DTL segment 220, as illustrated in FIG. 5. Subsequent additional DTL segments (not illustrated) would continue the alternating pattern between the first and second DTL segment connections.

According to some embodiments, the detector diodes 212, 222, 212', 222' of the DTL segments 210, 220, 210', 220' may be substantially similar to the detector diode 120 described above with respect to the traveling wave detector 100. In particular, in some examples, the detector diodes 212, 222, 212', 222' may comprise a backward tunneling diode. In other examples, the detector diodes 212, 222, 212', 222' may comprise a Schottky diode. In some embodiments, the detector diodes 212, 222, 212', 222' may comprise a combination of backward tunneling diode(s) and Schottky diode(s). According to some embodiments, the detector diodes 212, 222, 212', 222' may be substantially unbiased while in other embodiments, the detector diodes 212, 222, 212', 222' of one or more of the DTL segments 210, 220, 210', 220' may be biased while others thereof are substantially unbiased.

According to some embodiments, the DTL segments 210, 220, 210', 220' of the traveling wave detector 200 may comprise a segment of a transmission line that is substantially similar to the transmission line 110 described above with respect to the traveling wave detector 100. In particular, the first and second conductors 214a, 214b, 224a, 224b of the first and second DTL segments 210, 220 as well as conductors of the additional DTL segments 210', 220' may be substantially similar to the first and second conductors 118a, 118b of the transmission line 110, according to some embodiments. More particularly, according to various embodiments the transmission line segments of the DTL segments 210, 220, 210', 220' may be realized as either real transmission lines (e.g., microstrip, stripline, CPW, etc.) or artificial transmission lines including series inductors, as described above. Further, a length of one or more of the first and second DTL segments 210, 220 as well as of one or more of the additional DTL segments 210', 220' may be less than, and in some examples much less than, about $\lambda_{max}/4$, according to some embodiments.

In some embodiments, the traveling wave detector 200 further comprises a video output port (not illustrated). The video output port has a first terminal and a second terminal connected respectively to a first end and a second end of a conduction path through the detector diodes 212, 222, 212', 222' of the interconnected DTL segments 210, 220, 210', 220' of the traveling wave detector 200. Arrows next to the detector diodes 212, 222, 212', 222' in FIG. 5 illustrate the conduction path. According to various examples, the conduction path is defined by the DC blocks of the interconnected DTL segments 210, 220, 210', 220'.

The traveling wave detector 200 illustrated in FIG. 5 further comprises a resistive termination 260. The resistive termination 260 may comprise a substantially real-valued impedance (e.g., a resistor) that is matched to an impedance of the transmission line of the DTL segments 210, 220, 210', 220', according to various embodiments. The resistive termination 260 may be connected to a last DTL segment 210, 220, 210', 220' of the traveling wave detector 200 to absorb any residual input signal that is not absorbed by the various DTL segments 210, 220, 210', 220', for example.

In some embodiments, the traveling wave detector 200 employs an impedance of each of the DTL segments 210, 220, 210', 220' that is varied along a length of the traveling wave detector 200 from an input end (i.e., input port 202) to a terminal end 204. In some embodiments, the impedance is varied to differentially distribute a signal power level among the detector diodes 212, 222, 212', 222' of the DTL segments 210, 220, 210', 220'. In some embodiments, each detector diode 212, 222, 212', 222' is configured to receive about an equal portion of a signal power of the input signal due to the differential distribution.

Figure 6:
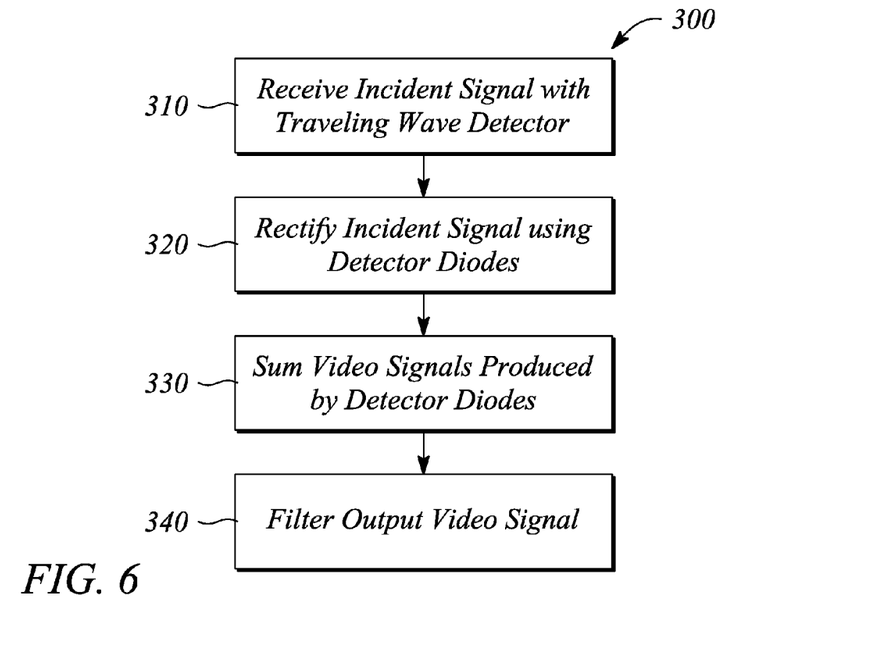
FIG. 6 illustrates a flow chart of a method of traveling wave signal detection, according to an embodiment of the present invention.

FIG. 6 illustrates a flow chart of a method 300 of traveling wave signal detection, according to an embodiment of the present invention. As illustrated, the method 300 of traveling wave signal detection comprises receiving 310 an incident signal using a traveling wave detector. According to various embodiments, the traveling wave detector comprises a plurality of detector diodes and a plurality of direct current (DC) blocks. The detector diodes of the traveling wave detector are spaced apart along a transmission line between an input end and a terminal end of the transmission line with adjacent ones of the detector diodes being connected according to a different polarity from one another. The plurality of DC blocks are arranged to define a series conduction path through the plurality of detector diodes, according to the various embodiments.

In some embodiments, the traveling wave detector is substantially similar to the traveling wave detector 100, 200 described above. In particular, a detector diode of the plurality may comprise a backward tunneling diode, in some examples. In other examples, the detector diode may comprise a Schottky diode. In yet other examples, the detector diode may be another diode such as, but not limited to, a planar doped barrier diode and a crystal detector. In some embodiments, the transmission line may comprise a real transmission line such as, but not limited to, a coaxial cable, a microstrip transmission line, a stripline transmission line, two-lead transmission line, and a CPW transmission line. In some embodiments, the transmission line is an artificial transmission line comprising a series of inductors. In some examples, the detector diodes are connected as shunt elements and are distributed between pairs of the series inductors along a length of the artificial transmission line. Further, the DC blocks may comprise series-connected capacitors that alternate between a first conductor and a second conductor of the artificial transmission line to define the series conduction path, according to some examples. In some examples, the transmission line comprises both a real transmission line and an artificial transmission line.

The method 300 of traveling wave signal detection illustrated in FIG. 6 further comprises rectifying 320 the incident signal using the detector diodes. Rectifying 320 the incident signal produces a video signal at each of the detector diodes. Further, the video signal is has a polarity defined by the series conduction path.

As illustrated in FIG. 6, the method 300 of traveling wave signal detection further comprises summing 330 the video signals produced at each of the detector diodes along the series conduction path. Summing 330 the video signals produces an output video signal. For example, the output video signal may be produced at a video output port of the traveling wave detector. The video output port may be substantially similar to the video output port 140 described above with respect to the traveling wave detector 100, for example. In particular, the video output port may comprise a first terminal and a second terminal, the first terminal being connected to the input port of the transmission line and the second terminal being connected to the terminal end of the transmission line. The video output port is configured to bridge the series conduction path, according to various embodiments.

In some embodiments, the method 300 of traveling wave signal detection further comprises filtering 340 the output video signal, as illustrated in FIG. 6. Filtering 340 may be accomplished using a lowpass filter, for example. In some embodiments, an impedance of the transmission line of the traveling wave detector used in the method 300 of traveling wave signal detection is varied along a length of traveling wave detector from the input end to the terminal end of the transmission line. The impedance is varied to differentially distribute a signal power of the incident signal among the detector diodes of the plurality. In some examples, the differential distribution of the signal power provides substantially equal signal power to each of the detector diodes.

Thus, there have been described examples of a traveling wave detector and a method of traveling wave signal detection that employ detector diodes connected according to different polarities with respect to adjacent ones of the detector diodes. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A traveling wave detector comprising:
a transmission line having a first conductor and a second conductor;
a plurality of detector diodes spaced apart along the transmission line between an input end and a terminal end of the transmission line, adjacent ones of the detector diodes being connected to the transmission line according to a different polarity with respect to one another;
a plurality of direct current (DC) blocks, DC blocks of the plurality of DC blocks being located alternately in the first conductor and the second conductor between the adjacent ones of the detector diodes to define a series conduction path through the plurality of detector diodes according to the different polarity connections; and
a video output port having a first terminal connected to the input end of the transmission line and a second terminal connected to the terminal end of the transmission line to bridge the series conduction path.

2. The traveling wave detector of claim 1, further comprising a low pass filter connected to filter a signal at the video output port.

3. The traveling wave detector of claim 1, wherein the transmission line is an artificial transmission line comprising a plurality of series inductors distributed along one or both of the first conductor and the second conductor of the artificial transmission line, the detector diodes being distributed between the series inductors along a length of the artificial transmission line, the detector diodes being connected as shunt elements between the first conductor and the second conductor, the DC blocks comprising series-connected capacitors.

4. The traveling wave detector of claim 1, further comprising a resistive termination connected in parallel with a detector diode of the plurality adjacent to the terminal end of the transmission line.

5. The traveling wave detector of claim 1, wherein a detector diode of the plurality comprises a backward tunneling diode.

6. The traveling wave detector of claim 1, wherein a transmission line impedance is varied along a length of the transmission line from the input end to the terminal end to differentially distribute a signal power of an input signal among the detector diodes of the plurality.

7. The traveling wave detector of claim 6, wherein the differential distribution of signal power provides about an equal distribution of signal power to each of the detector diodes.

8. The traveling wave detector of claim 1, wherein the transmission line comprises a coplanar waveguide (CPW), the first conductor comprising a central conductor of the CPW and the second conductor comprising adjacent ground plane conductors of the CPW, the detector diodes being connected between the central conductor and the adjacent ground plane conductor of the CPW, and wherein the DC blocks comprise capacitors that bridge gaps in the central conductor and the ground plane conductors between adjacent pairs of the detector diodes.

9. A traveling wave detector comprising:
a first diode-loaded transmission line (DTL) segment comprising a first detector diode and a first DC block, the first detector diode being connected according to a first polarity between a first conductor and a second conductor of a transmission line, the first DC block being located in the second conductor between an input of the first DTL segment and the first detector diode; and
a second DTL segment comprising a second detector diode and a second DC block, the second detector diode being connected according to a second polarity between the first conductor and the second conductor of the transmission line, the second DC block being located in the first conductor between an input of the second DTL segment and the second detector diode, the first polarity being different from the second polarity, wherein the input of the second DTL segment is connected to an output of the first DTL segment at corresponding ones of the first and second conductors.

10. The traveling wave detector of claim 9, further comprising one or more additional DTL segments connected in series to an output of the second DTL segment, each of the additional DTL segments having a respective detector diode and a respective DC block connected to alternate as in the first DTL segment and the second DTL segment, wherein each additional DTL segment has an input connected to an output of a preceding DTL segment at corresponding ones of the first and second conductors along a length of the traveling wave detector.

11. The traveling wave detector of claim 9, wherein the detector diode of any of the first and second the DTL segments comprises a diode selected from a backward tunneling diode and a Schottky diode.

12. The traveling wave detector of claim 9, further comprising a video output port having a first terminal and a second terminal connected respectively to a first end and a second end of a conduction path through the first and second detector diodes of the interconnected first and second DTL segments, the conduction path being defined by the first and second DC blocks.

13. The traveling wave detector of claim 9, wherein the transmission line in the first and second DTL segments comprises an artificial transmission line, one or both of the first conductor and the second conductor being a series inductor.

14. The traveling wave detector of claim 9, wherein an impedance of each of the first and second DTL segments is varied along a length of the traveling wave detector from an input end of the traveling wave detector to a terminal end of the traveling wave detector, the impedance being varied to differentially distribute a signal power level among the first and second detector diodes of the first and second DTL segments, each of the first and second detector diodes to receive about an equal portion of a signal power of a signal incident on the input end of the traveling wave detector due to the differential distribution.

15. A method of traveling wave signal detection, the method comprising:
  receiving an incident signal using a traveling wave detector, the traveling wave detector comprising a plurality of detector diodes and a plurality of direct current (DC) blocks, the detector diodes being spaced apart along a transmission line between an input end and a terminal end of the transmission line with adjacent ones of the detector diodes being connected between a first conductor and a second conductor of the transmission line according to a different polarity from one another, the plurality of DC blocks being located in the transmission line first and second conductors, the DC blocks being arranged to define a series conduction path through the plurality of detector diodes;
  rectifying the incident signal with the detector diodes to produce a video signal at each of the detector diodes; and
  summing the video signals produced at each of the detector diodes along the series conduction path to produce an output video signal at a video output port having a first terminal connected to the transmission line input end and a second terminal connected to the transmission line terminal end.

16. The method of traveling wave signal detection of claim 15, wherein a detector diode of the plurality comprises a backward tunneling diode.

17. The method of traveling wave signal detection of claim 15, wherein the transmission line is an artificial transmission line comprising a plurality of series inductors distributed along one or both of the first conductor and the second conductor of the artificial transmission line, the detector diodes being distributed between the series inductors along a length of the artificial transmission line, the detector diodes being connected as shunt elements between the first conductor and the second conductor, the DC blocks comprising series-connected capacitors located in and alternating between the first conductor and the second conductor to define the series conduction path.

18. The method of traveling wave signal detection of claim 15, further comprising filtering the output video signal using a lowpass filter.

19. The method of traveling wave signal detection of claim 15, wherein an impedance of the transmission line is varied along a length of the traveling wave detector from the input end to the terminal end to differentially distribute a signal power of the incident signal among the detector diodes of the plurality.

20. A traveling wave detector comprising:
  a transmission line having an input end and a terminal end;
  a plurality of detector diodes spaced apart along the transmission line between the input end and the terminal end, adjacent ones of the detector diodes being connected to the transmission line according to a different polarity with respect to one another;
  a plurality of direct current (DC) blocks, the DC blocks to define a series conduction path through the plurality of detector diodes according to the different polarity connections; and
  a video output port having a first terminal connected to the input end of the transmission line and a second terminal connected to the terminal end of the transmission line to bridge the series conduction path,
  wherein the transmission line comprises a coplanar waveguide (CPW) having a first conductor comprising a central conductor and having a second conductor comprising adjacent ground plane conductors, the detector diodes being connected between the first conductor and the second conductor of the CPW, and wherein the DC blocks comprise capacitors that bridge gaps in the central conductor and that bridge ground plane conductors between adjacent pairs of the detector diodes.

* * * * *